United States Patent [19]

Hynecek

[11] Patent Number: 5,182,623
[45] Date of Patent: Jan. 26, 1993

[54] CHARGE COUPLED DEVICE/CHARGE SUPER SWEEP IMAGE SYSTEM AND METHOD FOR MAKING

[75] Inventor: Jaroslav Hynecek, Richardson, Tex.

[73] Assignee: Texas Instruments Incorporated, Dallas, Tex.

[21] Appl. No.: 682,858

[22] Filed: Apr. 5, 1991

Related U.S. Application Data

[63] Continuation of Ser. No. 435,649, Nov. 13, 1989, abandoned.

[51] Int. Cl.[5] .................... H01L 29/78; H01L 27/14; H01L 31/00
[52] U.S. Cl. .................... 257/230; 377/60; 377/62; 333/165; 333/138; 358/213.19; 358/213.24; 358/213.31; 257/233; 257/241; 257/242; 257/245
[58] Field of Search ............ 357/24 LR, 30 D, 30 G, 357/30 H, 30 Q, 51, 24, 24 M; 377/60, 61, 62, 63; 333/165, 138; 358/213.19, 213.24, 213.31

[56] References Cited

U.S. PATENT DOCUMENTS

| | | | |
|---|---|---|---|
| 3,944,850 | 3/1976 | Walden | 333/165 |
| 4,139,784 | 2/1979 | Sauer | 357/24 |
| 4,152,606 | 5/1979 | Hornak | 377/63 |
| 4,249,145 | 2/1981 | Sakaue et al. | 333/165 |
| 4,447,735 | 5/1984 | Horii | 357/24 LR |
| 4,489,423 | 12/1984 | Suzuki | 357/24 LR |
| 4,612,521 | 9/1986 | Kleefstra et al. | 333/165 |
| 4,639,940 | 1/1987 | Ohtsuki | 333/165 |
| 4,716,580 | 12/1987 | Berger | 357/24 |
| 4,719,448 | 1/1988 | Yoshimura | 357/24 |
| 4,774,586 | 9/1988 | Koike et al. | 357/24 LR |
| 4,794,279 | 12/1988 | Yamamura et al. | 357/24 LR |
| 4,866,496 | 9/1989 | Audier | 357/24 LR |
| 4,912,560 | 3/1990 | Osawa et al. | 357/24 LR |

FOREIGN PATENT DOCUMENTS

| | | | |
|---|---|---|---|
| 55-90124 | 7/1980 | Japan | 333/165 |
| 56-119994 | 9/1981 | Japan | 333/165 |
| 1-168113 | 7/1989 | Japan | 333/138 |

*Primary Examiner*—Andrew J. James
*Assistant Examiner*—Ngan Van Ngo
*Attorney, Agent, or Firm*—Troy J. Cole; Richard L. Donaldson; James C. Kesterson

[57] ABSTRACT

Described is a new high performance CCD image sensor technology which can be used to build a versatile image sensor family with the sensors that have high resolution and high pixel density. The described sensor architectures are based on a new charge super sweep concept which was developed to overcome such common problems as blooming and the image smear. The charge super sweep takes place in very narrow vertical channels located between the photosites similar to the Interline Transfer CCD devices. The difference here is that the charge is never stored in these regions for any significant length of time and is swept out using a new resistive gate traveling wave sweeping technique. The charge super sweep approach also allows the fast charge transfer of several lines of data from the photosites located anywhere in the array into the buffer storage during a single horizontal blanking interval.

23 Claims, 16 Drawing Sheets

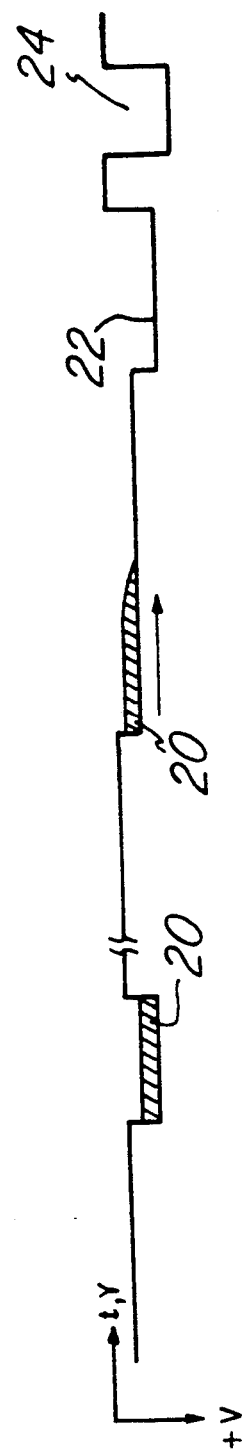

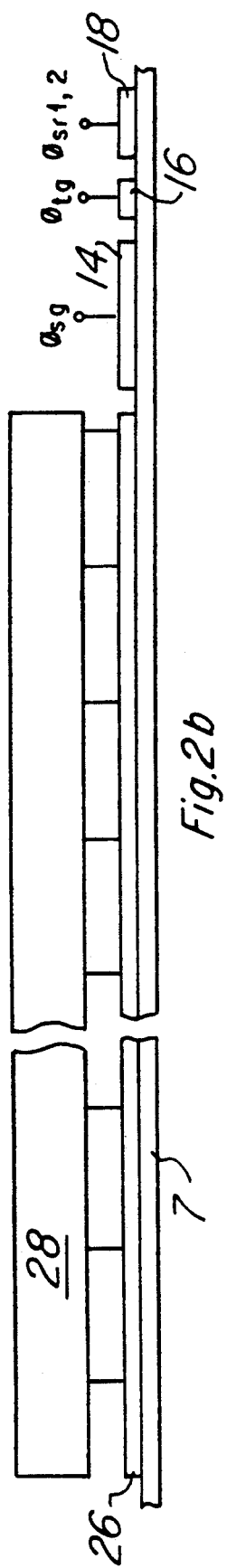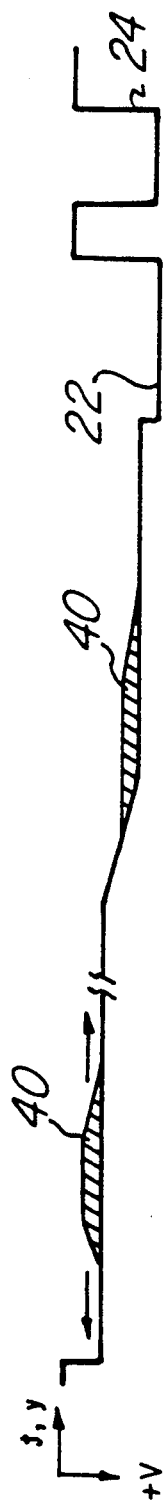

CHARGE COUPLED DEVICE/CHARGE SUPER SWEEP IMAGE SYSTEM AND METHOD FOR MAKING

This application is a continuation of application Ser. No. 07/435,649, filed Nov. 13, 1989, now abandoned.

BACKGROUND OF THE INVENTION

1. Field of the Invention

The present invention pertains to a novel high performance charge-coupled device (CCD) image sensor for use in optical imaging systems and particularly to a new device design and architecture providing enhanced sensitivity and control of charge carriers concurrent with higher pixel density and smaller sensor size.

2. Description of Prior Art

The key problem existing in all solid-state image sensors, in addition to the requirement for efficient sensing and conversion of an image into pixels of charge representing an image signal, is addressing and delivering the image signal to the sensor output terminals with high speed and in a predetermined sequence. The CCD approach has been popular in its use for this purpose because of its inherent ease in manipulation and transport of charge within a silicon chip. However, the disadvantage of the CCD approach resides in its requirement for wide charge transfer channels which consume valuable image sensing area and in the sensitivity to collection of stray charge which leads to image smear. As the demand for image sensors having high resolution, high pixel density and small size steadily grows, several techniques have been developed for enhancement of CCD image sensors to minimize these limitations on sensor performance.

One such enhancement technique has combined a charge sweep method with interline transfer (IT) architecture commonly used with CCD image sensors. ("Super Small TV Camera Using CSD Device," K. Takashima, Image Technology and Information Display, Vol. 20, No. 9, pp. 47-51, May 1988). This technique significantly decreases the size of the vertical charge transfer channels interposed between columns of photosite sensing elements and thus improves the quantum efficiency of the CCD. However, the time required for charge sweep from the sensing element in the array is relatively large and the limitation of unwanted smear is not completely resolved.

The present invention describes a new CCD image sensor and methodology which overcomes the limitations of conventional CCD image sensors and which provides high resolution, high pixel density, decreased size and greatly enhanced performance. New sensor architectures are described which use a charge super sweep (CSS) technique to overcome common CCD problems such as blooming and image smear. The described invention also provides image sensors having intrinsic exposure control, using an electronic focal plane shutter technique, with a single or variable scan rate.

The charge super sweep technique allows the fast transfer of several lines of data from photosites located anywhere in a pixel array into a buffer storage area located at a lower edge of the image sensing region of the sensor. The transfer is performed during every horizontal blanking interval, or only during the vertical blanking interval if the transfer of a full frame of data is desired. For the image sensor having frame transfer capability, one or more on-chip analog field memories are incorporated similar to conventional frame transfer CCD sensors and the sensor can be used for still picture photography applications.

The charge super sweep (CSS) technique uses very narrow vertical channels located between the photosites similar to interline transfer (IT) devices. The CSS technique is distinguishable, however, in that the charge from the photosites is never stored in the channels for any significant length of time and is swept out using a resistive gate traveling wave technique. The narrow channels minimize loss of light sensitivity and the traveling wave sweep maximizes the charge transfer efficiency in the narrow channels by using a field enhanced charge carrier drift effect.

SUMMARY OF THE INVENTION

A principle object of invention is to provide a new CCD/CSS image sensor and method for making same using a traveling wave charge super sweep technique.

A further object of invention is to provide an architecture for a novel CCD/CSS image sensor.

Yet another object of invention is to provide a new photosite element for a CCD image sensor and a process for integrating the new CCD photosite element and CMOS structures on the same chip.

A further object of invention is to provide a new detection amplifier circuit for a CCD image sensor.

A yet further object of invention is to provide a new scanner circuit for use with a CCD/CSS image sensor.

With the foregoing objects in view, the present invention is achieved by a planar array of photosites, an address decoder receiving address input data and coupled to the photosite array, a series of resistive gate CCD charge transfer channels coupled to receive charge transferred from associated columns of photosites in said array, said series of transfer channels coupled to and driven by a scanner circuit, a series of charge storage wells for storing said charge transferred in associated ones of said transfer channels and a plurality of registers for receiving charge from associated ones of said storage wells and for reading out said charge as an image signal.

A further embodiment of the present invention is achieved including a series of multiplexers coupled between associated ones of said storage wells and said registers such that the charge in the registers is read out in a number of selected output channels.

Yet another embodiment of the present invention is achieved including a number of field memories coupled between the multiplexers and the registers for storage and processing entire frames of data.

BRIEF DESCRIPTION OF THE OFFICIAL DRAWINGS

FIGS. 1a-1c show schematics of a top and side view of a prior art CCD image sensor using segmented charge transfer channels and a profile of the charge potential in a vertical transfer channel.

FIGS. 2a-2c show schematics of a top and side view of a new CCD/CSS image sensor using continuous resistive gate charge transfer channels coupled to a novel scanner circuit and a profile of the potential in a vertical resistive gate charge transfer channel.

FIG. 9a illustrates a timing diagram showing the operational pulse sequence for the detection node/amplifier circuit of FIG. 8a.

Figure 10A:
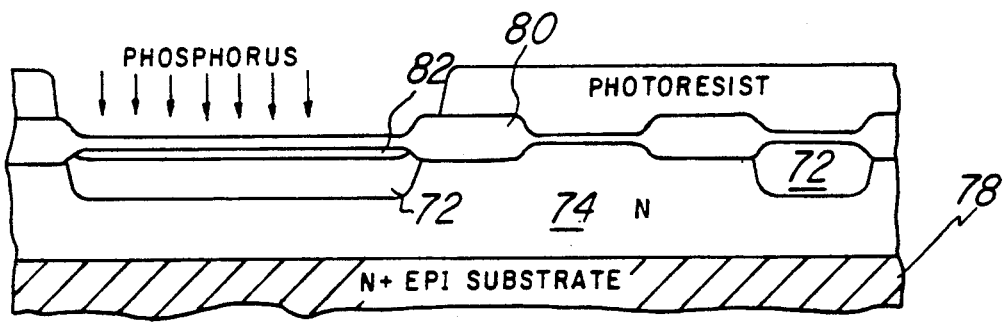
Figure 10B:
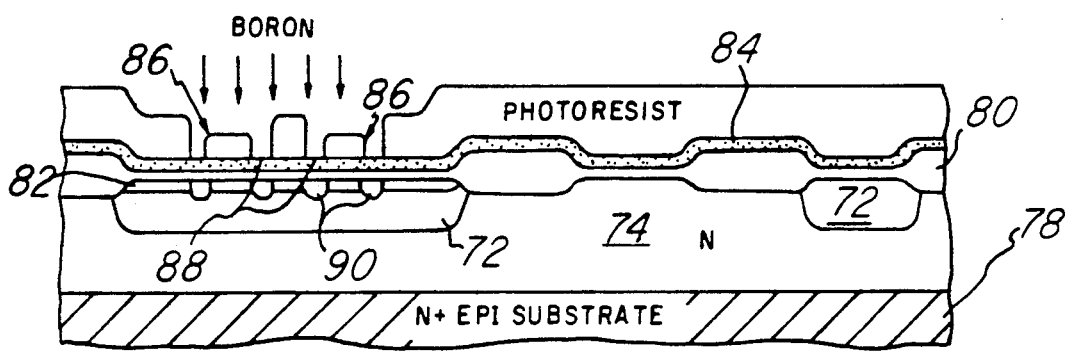
Figure 10C:
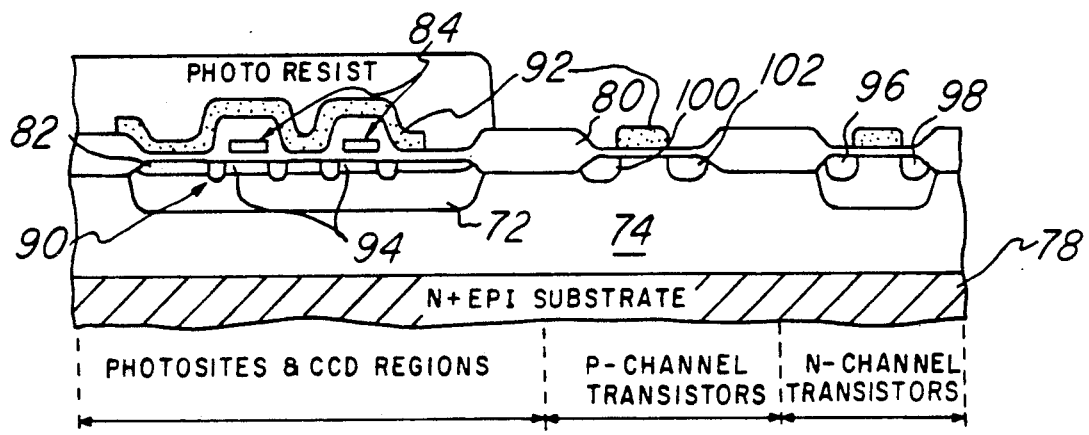

FIGS. 10a-c show cross-section views of selected stages in fabrication of an N-type buried channel CCD integrated on the same chip with P-well CMOS structures to form the CCD/CSS image sensor of the present invention.

FIGS. 11a-b show top and cross-section views along AA and A'A' of an image sensor cell for the CCD/CSS image sensor.

Figure 12:
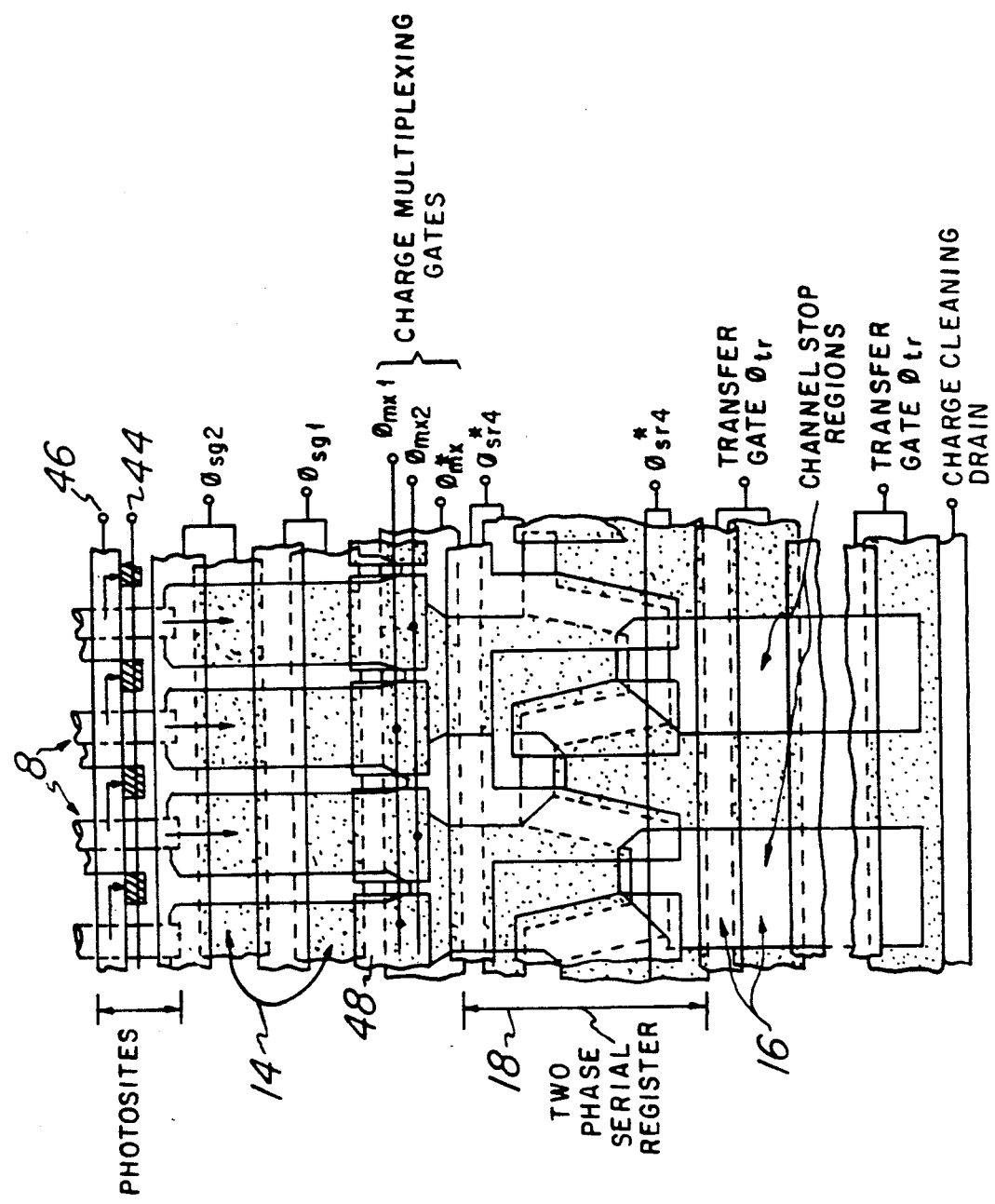

FIG. 12 is a schematic of the important regions of the new CCD/CSS image sensor of the present invention showing charge collection wells, multiplexers, serial registers with transfer gates and a charge clearing drain.

DESCRIPTION OF THE PREFERRED EMBODIMENT

Figure 1A:
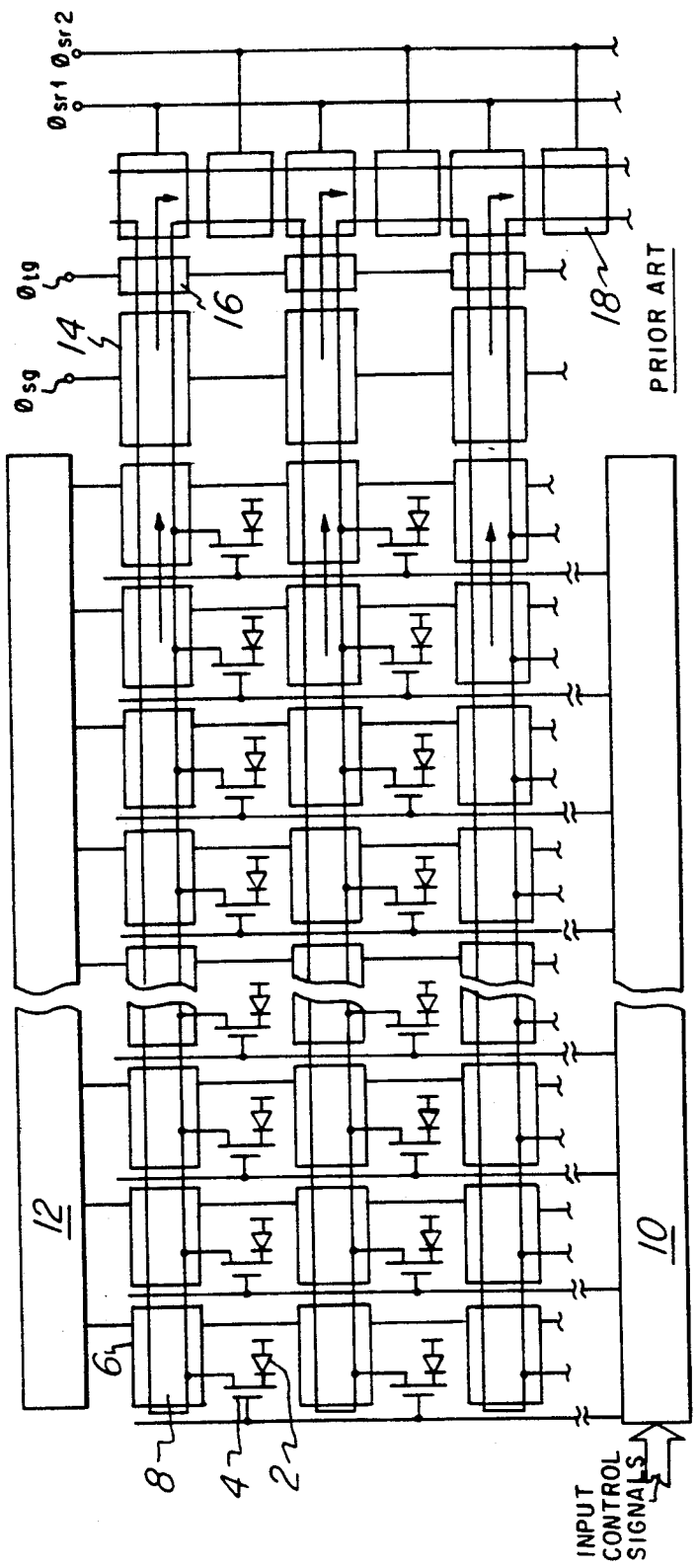
Figure 1B:
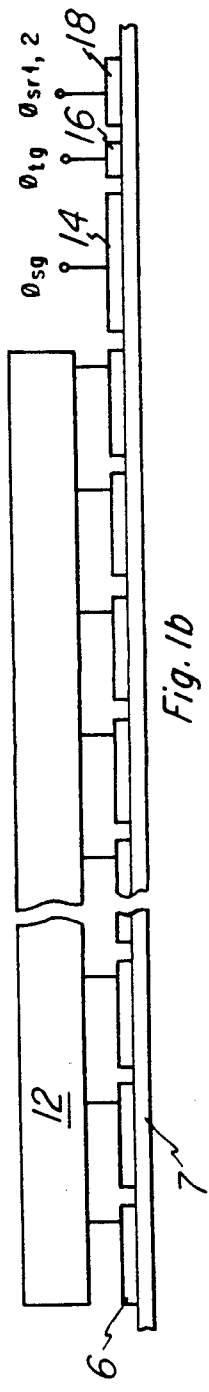

Referring to FIGS. 1a-c, a schematic of a prior art CCD image sensor is illustrated. Formed in a semiconductor substrate (not shown) is a planar array of photosites 2 represented as diodes, each photosite coupled by a charge transfer device 4, a transistor for example, to an associated charge transfer gate 6. The charge transfer gates 6 form a vertical columnar array on an insulator layer 7 overlaying vertical charge transfer channels 8 in the substrate. An address decoder 10 accepts input control signals by which selected rows of charge transfer devices 4 are controlled to transfer charge accumulated in the photosites 2 to associated vertical charge transfer channels 8. A scanner 12 is coupled to all the transfer gates 6 such that the charge can be swept in sequence down the transfer channels 8 as distinct horizontal rows of charge representing lines of signal into a row of associated charge storage wells 14. An applied voltage pulse $\phi_s$ holds the charge in storage wells 14 until a subsequent voltage pulse $\phi_{tg}$ applied to associated charge transfer gates 16 transfers the charge row to a horizontal register 18. The charge is then read out from the horizontal register as lines of image signal under control of applied voltage pulses $\phi_{sr1}, \phi_{sr2} \ldots$ FIG. 1c shows a potential profile of a charge row 20 as it is swept along the vertical charge transfer channels to charge storage potential well 22 and horizontal register potential well 24.

The capability to address distinct lines of charge permits fabricating narrow vertical charge transfer channels 8 having smaller charge well capacity since the charge accumulated in the individual photosites can span several vertical stages in the CCD. However, due to the narrow width of the vertical charge transfer channels 8, the charge transfer efficiency suffers and it is not possible to transfer a row of charge or line of signal from the top to the bottom of the array within a single horizontal blanking interval. This complicates timing of the image sensor and also results in prolonged charge storage in the vertical charge transfer channels where additional stray charge from other photosites in the CCD may accumulate resulting in image smear. There also exists the problem of clock signal feed-through to the horizontal register 18 from the storage registers 14 since these registers must be active during the readout interval as a result of the inability to completely sweep the charge from the vertical transfer channels 8 during the blanking interval.

In order to transfer a row of charge across the entire image sensor height in a few microseconds available during the horizontal blanking interval of present imaging systems, a vertical clocking frequency on the order of 100 MHz is required for the large number of vertical CCD photosites. Such a clocking frequency is difficult to achieve in view of the relatively high loading capacitance of the vertical charge transfer gates 6. The problem is further compounded by the requirement for narrow vertical charge transfer channels as described above.

An attempted solution to the rapid charge transport problem is to replace the segmented array of charge transfer gates 6 with a series of continuous columnar resistive gates as proposed by R. Zimmerman in "RGS Image Sensor for Black and White Cameras," Elektronik, Vol. 32, No. 12, pp. 91-92, June 1983 and R. E. Colbeth et al. in "GHz GaAs CCD's: Promises, Problems and Progress", Proceedings of SPIE, Vol. 1071, pp. 108-114, January 1989. The advantage of using the resistive gate resides in having a large lateral electrical field along the direction of charge transport which significantly enhances the transport speed of the charge carriers according to the equations $$E_t = V/L_n$$

where
$E_t$ = the tangential electric field between charge transfer gates
V = the voltage applied along the charge transfer gate
$L_n$ = length of a charge transport gate (carrier drift length)

and $$L_n \tau \mu E_t$$

where
$\tau$ = mean drift time of the charge carriers
$\mu$ = charge mobility.

A significant disadvantage, however, of a resistive gate approach is the large power consumption by any device using this technique. Conventional multiphase CCDs may turn on thousands, or potentially millions of parallel-connected charge transfer gates with each clock pulse for large arrays. The resistive load of all the parallel-connected charge transfer gates is then extremely low and no adequate driving circuit can be built on the same chip with the imaging array because of the very high power required.

Figure 2A:
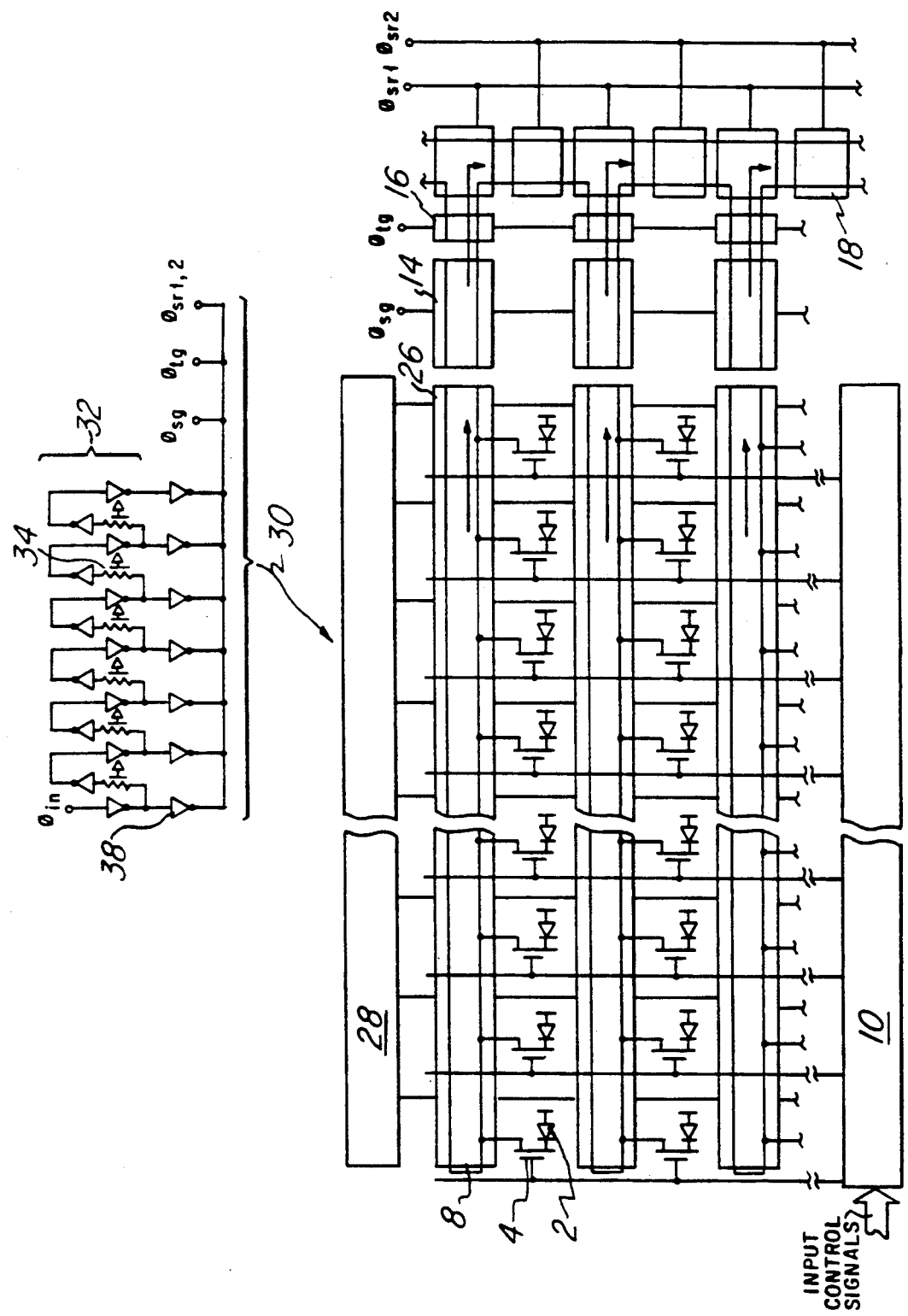

With reference to FIGS. 2a-c, a new CCD charge super sweep (CCD/CSS) is shown overcoming the above-mentioned limitations FIGS. 2a-b show a structure similar to that of FIGS. 1a-b except that the segmented vertical charge transfer gates 6 are replaced with continuous vertical resistive gates 26 and a novel scanner 28 using a traveling wave driver circuit 30 as shown in FIG. 2A is used to sweep the charge down the vertical charge transfer channels 8 underlying the resistive gates 26. The traveling wave driver circuit 30 is formed as a linear delay line 32, by way of example and not limitation, having pairs of inverters 34 spaced between distributed RC networks 36 and the delay line 32 is tapped at selected points by high current drivers 38 coupled to the resistive gates 26. FIG. 2c illustrates the potential profile of a column of charge or line of signal 40 as it is swept along the vertical charge transfer channels 8 to the charge storage wells 14.

With the new CCD/CSS image sensor, the power consumption is greatly reduced relative to previous CCD image sensors since current flows only in the few driver stages 38 which are in transition from high to low at any selected time or low to high if CMOS circuits are used to build the drivers. The on-chip load for the CCD/CSS image sensor thus corresponds to a single row of resistive gates from photosites connected in parallel requiring a driving current easily manageable with present technology.

The charge in the vertical charge transfer channels 8 of the CCD/CSS image sensor is swept across the entire image sensor height by a traveling wave field within approximately one microsecond or less. Such a complete and rapid sweep of the charge transfer channels permits the further advantages of using the channels for consecutive transfer of several lines of data within the horizontal blanking interval; the clearing of selected photosites of unwanted charge to facilitate exposure control; and clearing the charge transfer channels of stray charge from charge blooming overflow during the charge integration time in the photosites. The fast charge transfer is also beneficial for low smear of the sensor.

Figure 3:
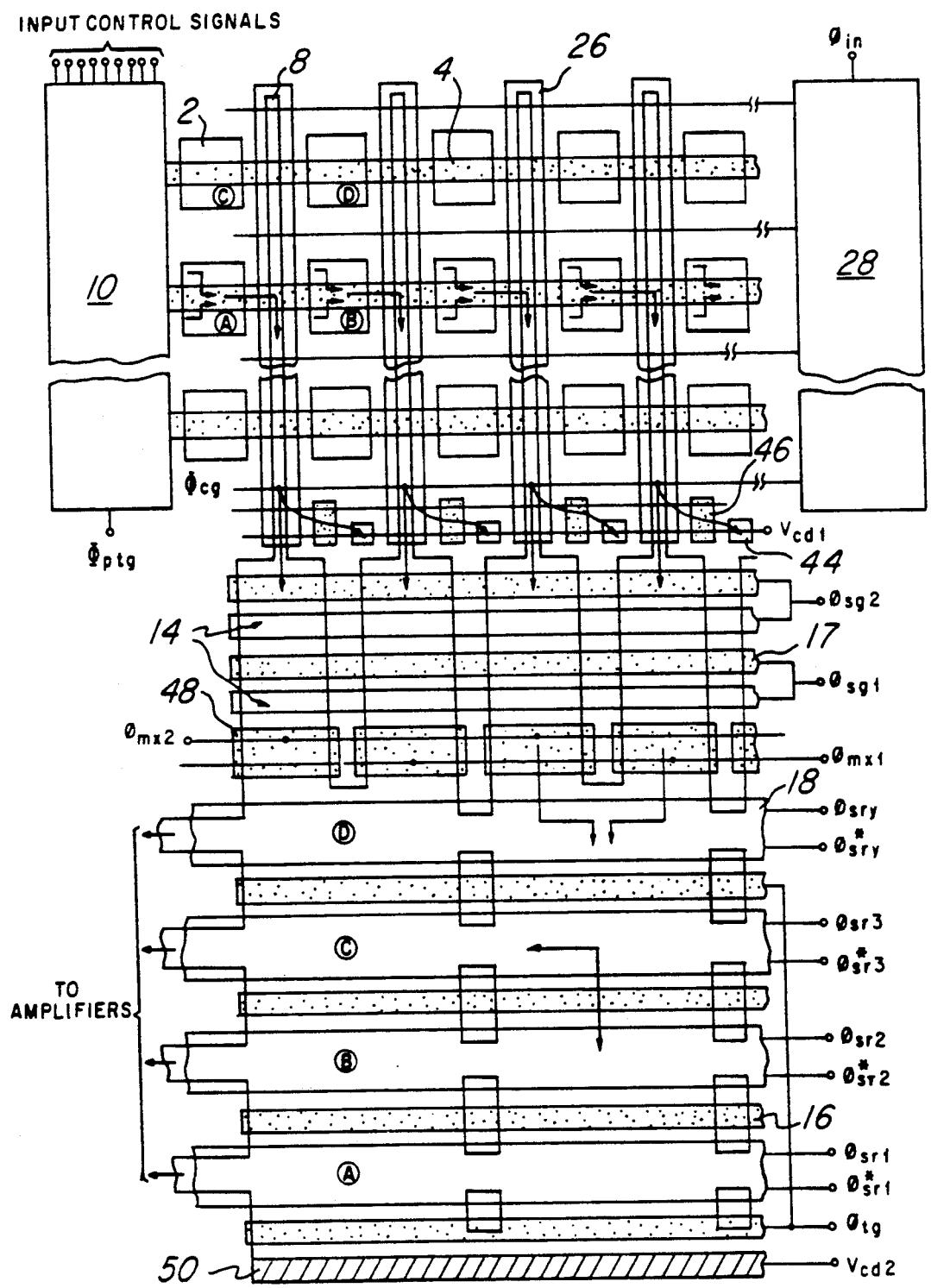
FIG. 3 is a schematic of a CCD/CSS image sensor having an architecture similar to interline transfer devices with multiple channel readout.

Two basic image system architectures using the CCD/CSS image sensor described above can be built providing greatly enhanced imaging systems over the prior art. A first such architecture is shown in FIG. 3. In addition to the basic CCD/CSS image sensor shown in FIG. 2b, a clearing gate 46 and drain 44 are located near the bottom of each vertical charge transfer channel 8 such that a clearing gate pulse $\phi_{cg}$ can direct the charge in the vertical charge transfer channels 8 to a pair of storage well 14 via charge storage transfer gates 17 or to drains 44 via charge clearing gates 46. A series of multiplexing charge storage gates 48 are connected to two multiplexers such that by proper timing pulses $\phi_{mx1}$, $\phi_{mx2}$ from the multiplexers and $\phi_{tg}$ from the register transfer gates 16, charge can be transferred into a series of horizontal storage registers 18 for multichannel readout of the image signal to an associated series of amplifiers. A second vertical clearing drain 50 is placed at the bottom of the horizontal registers 18 such that unwanted charge can be cleared from the registers between readout intervals. This first system architecture is similar to line transfer device (LTD) architectures of prior art. However, the LTD charge super sweep (LTD/CSS) architecture offers the advantage of accessing and reading out any row or row pair of photosites representing a line or line pair of image signal on the photosite array during a single horizontal blanking interval. Furthermore, it can perform this function and additionally clear the photosites 2; vertical charge transfer channels 8; storage registers 14 and horizontal registers 18 of unwanted charge during the same interval. By comparison, conventional CCD image systems cannot fully sweep a single line of signal the entire height of the imaging array during the horizontal blanking interval.

Figure 4:
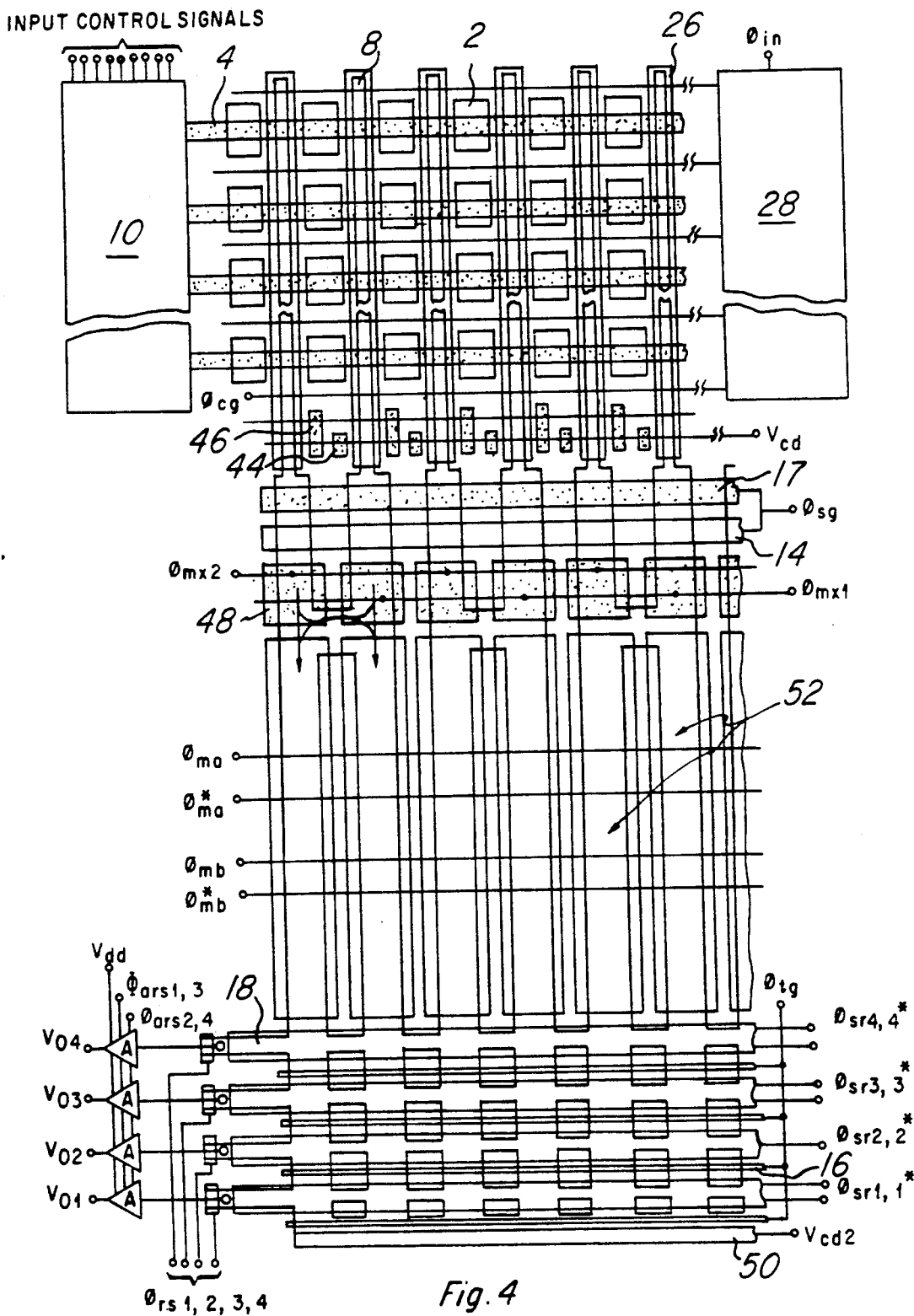
FIG. 4 is a schematic of a CCD/CSS image sensor having an architecture similar to frame interline transfer devices with multiple channel readout.

With reference to FIG. 4, a second image system architecture is shown using the new CCD/CSS image sensor. This architecture is similar to that of FIG. 3 except that this embodiment has a single charge storage register 14 at the bottom of the imaging array and has two field memories 52 interposed between the multiplexer gates 48 and the horizontal registers 18 such that entire frames of signal can be stored for readout. Conventional frame interline transfer (FIT) architecture requires transfer of all lines of signal across a sensor in parallel to a frame memory. The new CSS approach permits transfer of individual lines of signal to a frame memory. If desired, charge clearing sweeps of the vertical charge transfer channels may be performed between such individual transfers. Thus the new FIT/CSS image system offers inherent exposure control and antiblooming control hereto unobtainable. It should be noted that the LTD/CSS architecture of FIG. 3 is used principally in movie cameras or still picture cameras having a mechanical shutter while the field memory of the second architecture permits use with still video cameras and provides capability of a variable speed electronic focal plane shutter.

Figure 5:
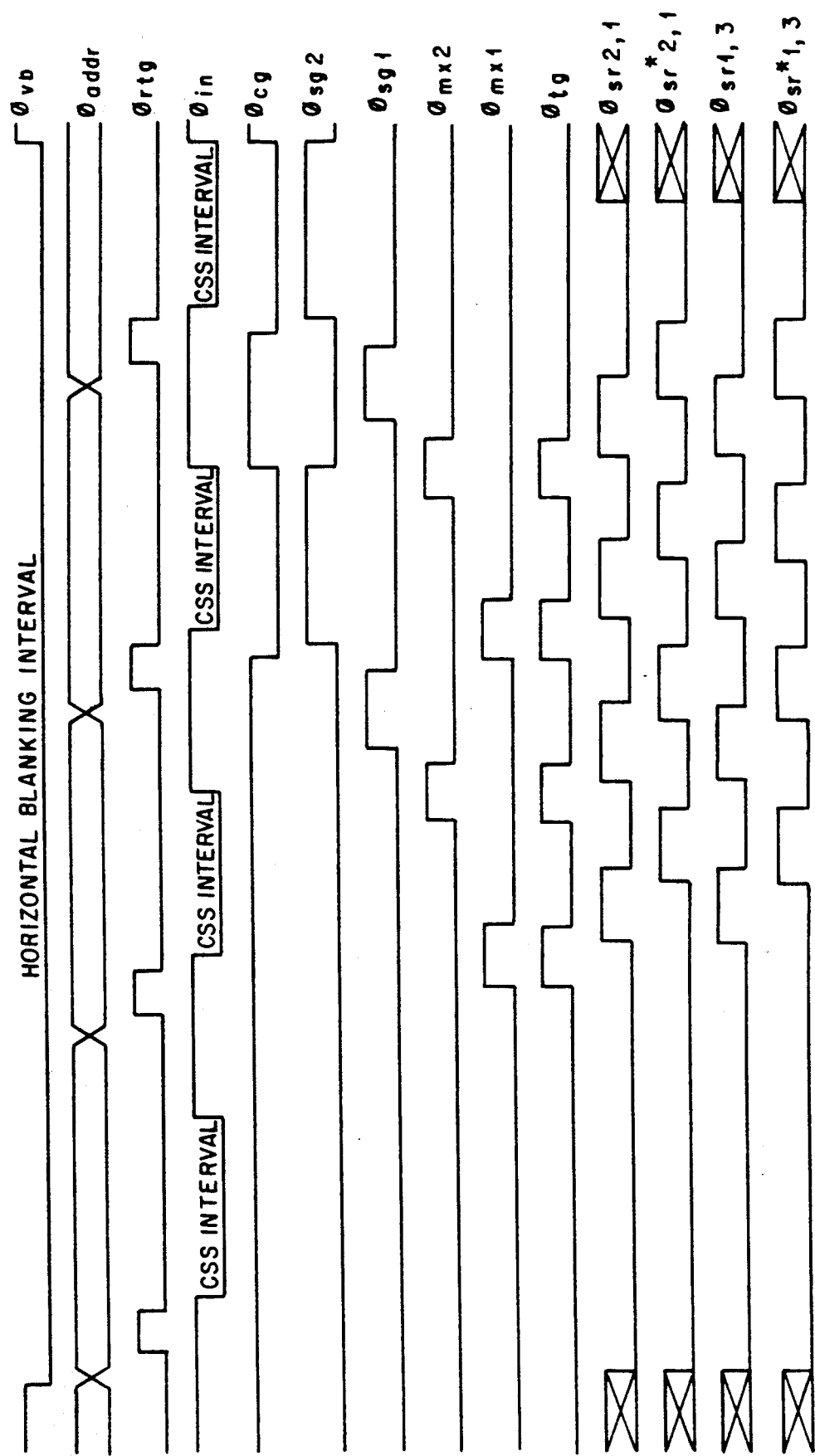
FIG. 5 is a timing diagram for a CCD/CSS image sensor made according to the present invention showing the pulse sequence of operation which occurs during the horizontal blanking interval.

With reference to the timing diagram of FIG. 5 and FIG. 3, a more detailed description of the LTD/CSS image system architecture is given for demonstration of the inherent exposure control and antiblooming capability provided by the new architecture.

The operating cycle starts as follows: during the horizontal blanking interval a binary address is input into the address decoder 10 and a charge transfer pulse is applied to the transfer gates 4 of the selected photosites 2. This clears the photosites 2 of unwanted charge and determines the starting point for the charge integration period. After this cycle is completed, another line of photosites 2 can be cleared of charge if the device is designed for dual line readout. The charge now resides in the vertical charge transfer channels 8 and can be swept to the buffer storage area represented by the charge storage wells 14. To remove unwanted charge and to control the blooming, charge clearing gate 46 can direct the charge from the vertical charge transfer channels, 8 to either the charge storage wells 14 or to the drains 44 as needed any time in the course of the device operating cycle. The vertical charge transfer channels 8 can also be swept clean prior to any charge transfer from the photosites 2 to prevent residual reverse charge flow to the photosites 2. It is a good practice to include the charge clearing sweep before every transfer of valid data into the storage wells 14.

Blooming protection could be incorporated into the LTD/CSS sensor system as is customary in conventional CCD image systems by using a vertical overflow drain in each photosite 2. However, this unnecessarily complicates the fabrication process and is not used in the new LTD/CSS image system. A vertical overflow drain also reduces the sensor light sensitivity in the longer wavelengths of the visible and near infrared regions of the spectrum. This is an undesirable drawback if the image system is to compete in surveillance and security applications. Thus blooming control in the LTD/CSS image system is accomplished as described above by sweeping out the photosite overflow charge from the vertical charge transfer channels prior to every transfer in each horizontal blanking interval. The traveling wave driver circuit 30 in concert with the resistive gates 26 of the new CCD/CSS image sensor make such a rapid charge sweep and subsequent blooming control possible.

After the vertical charge transfer channels 8 are cleared of the unwanted charge, they are ready to receive the charge from selected photosites 2 representing a line of image signal. The decoder binary code input to the address decoder 10 is changed to an appropriate address and the charge in the corresponding photosites 2 is transferred to the vertical charge transfer channels and swept into the storage wells 14. In this step the address is changed by a decrement corresponding to the number of lines representing the width of a focal plane shutter. The second line of signal can immediately follow this step or another clearing sweep can be inserted between the lines of signal to eliminate any stray charge. Since the charge super sweep time is on the order of a microsecond, the smear level is very low. Even if the vertical charge transfer channels 8 are completely unprotected by a light shield, the smear signal is low because of the rapid sweep time provided by the new CCD/CSS image sensor. The smear signal is approximated by the ratio of the charge sweep time to the charge integration time in the photosites, and for a CCD/CSS device which has, for example, 982 lines with a test pattern covering one tenth of the picture height, the ratio is only 0.61%. If a standard aluminum light shield is incorporated with the image sensor, this value is easily improved by at least two orders of magnitude.

The buffer storage area of the new image sensor system can be configured to hold several lines of data in storage wells 14 as in FIG. 3 or it can be extended to hold the data from the entire sensor in field memories 52 as in FIG. 4. In the latter case the device has also a variable speed electronic focal plane shutter capability. The lines of photosites 2 can be cleared in a quick succession of sweeps and the whole image sensing area can be reset within a millisecond. The signal can then be integrated in the photosites 2 in the next interval and again quickly 3 transferred into the buffer storage area. Other combinations of timing are also possible where the rate of the scan is selected anywhere between the above mentioned maximum and the standard TV rate of 1/30 of a second. This feature is most useful in still picture cameras where it resembles the action of a mechanical focal plane shutter having both variable slit width and variable speed.

Once the signal has been transferred into the storage buffer area, it is easily multiplexed into any number of formats and then transferred to the horizontal registers 18 for readout. One example format selected for the new CCD/CSS image sensor permits reading a signal in a block of four photosites 2 through four serial registers 18. The first and the second register contain the signal from the odd and even photosites 2 of the even lines of signal and the third and fourth register contain the signal from the odd and even pixels of the odd lines of signal. Since line addressing is accomplished through a decoder 10, the addressing order of lines is not fixed and can be changed from field to field if an interlaced dual line readout is required. The selected multiple channel output allows a fast data readout from the sensor with only a modest clocking frequency of 12.8 MHz. This is an important advantage for the design of the output amplifiers which must have high gain and low noise.

Figure 6:
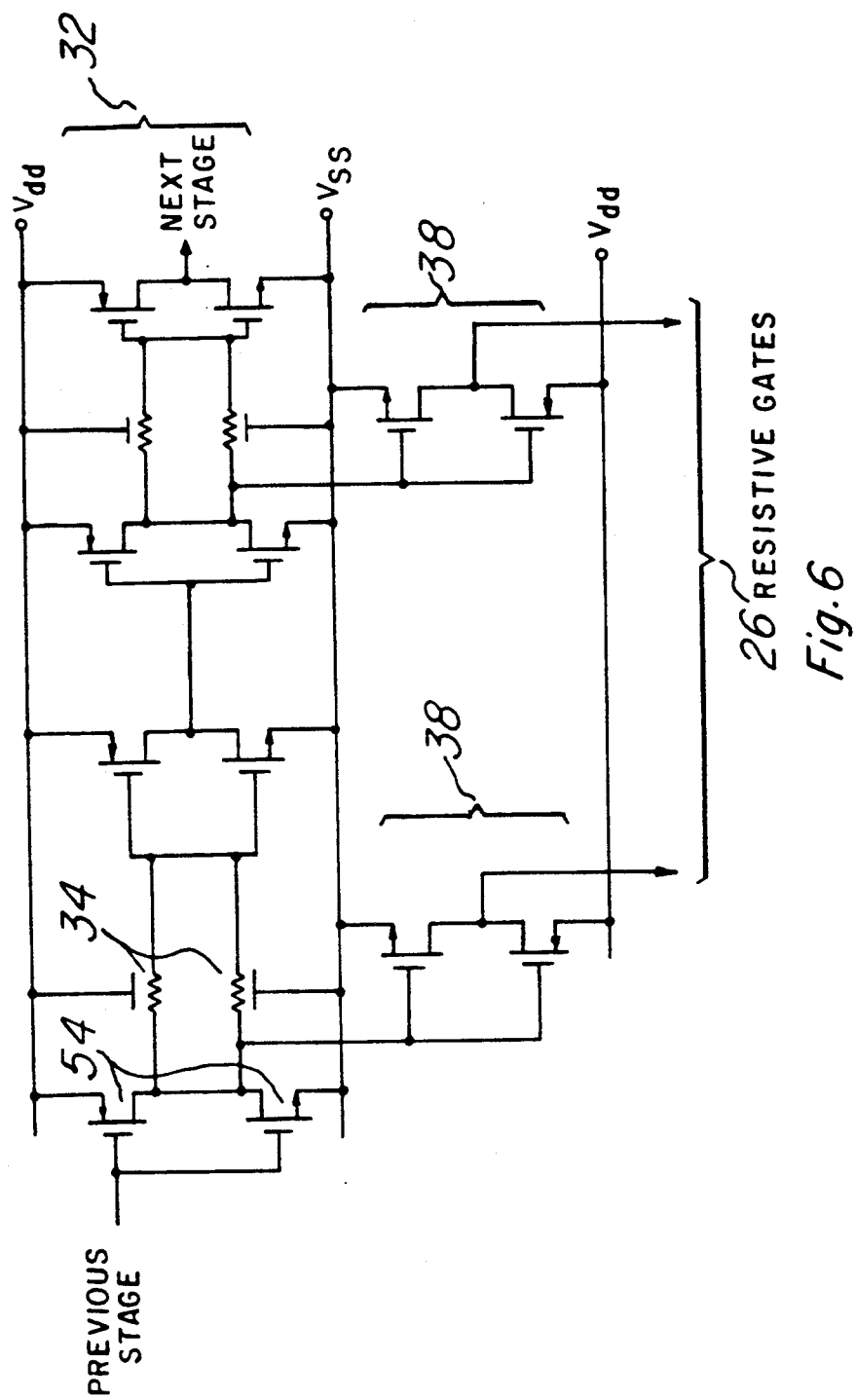
FIG. 6 illustrates a circuit diagram of a traveling wave driver circuit for use in the scanner for the new CCD/CSS image sensor showing the CMOS inverter stages and the distributed RC networks used to construct the circuit.

Essential to development of the new CCD/CSS image sensor is the new scanner 28 which incorporates a new Traveling Wave Driver circuit 30 needed to generate the charge super sweep field in the vertical charge transfer channels 8. A circuit diagram of an example traveling wave driver circuit 30 is shown in FIG. 6. For actual operation of the new CCD/CSS image sensor, there are two columns of identical CMOS high current drivers 38 placed on both sides of the photosite array to minimize propagation delays to the center of the array. The drivers 38 receive their signal from the delay line circuit 32 which consists of a chain of CMOS inverters 54 interconnected by RC distributed networks 34 as shown. The parameters of the networks are selected such that the signal delay through the networks is slightly larger than the propagation speed of electrons in the vertical charge transfer channels. This assures a good transfer efficiency as well as the maximum transfer speed. The earlier equations defining the electric field strength and carrier drift length for efficient design of the CCD/CSS image sensor indicate that it is not necessary to have a driver 38 for each row of photosites 2. Several rows can be skipped to satisfy the design rules for sensor fabrication and still provide space for the transfer gate address busses. However, it is still necessary to place dummy metal lines between the scanner and the photosite array to maintain the optical symmetry and photosite optical response uniformity.

Figure 7:
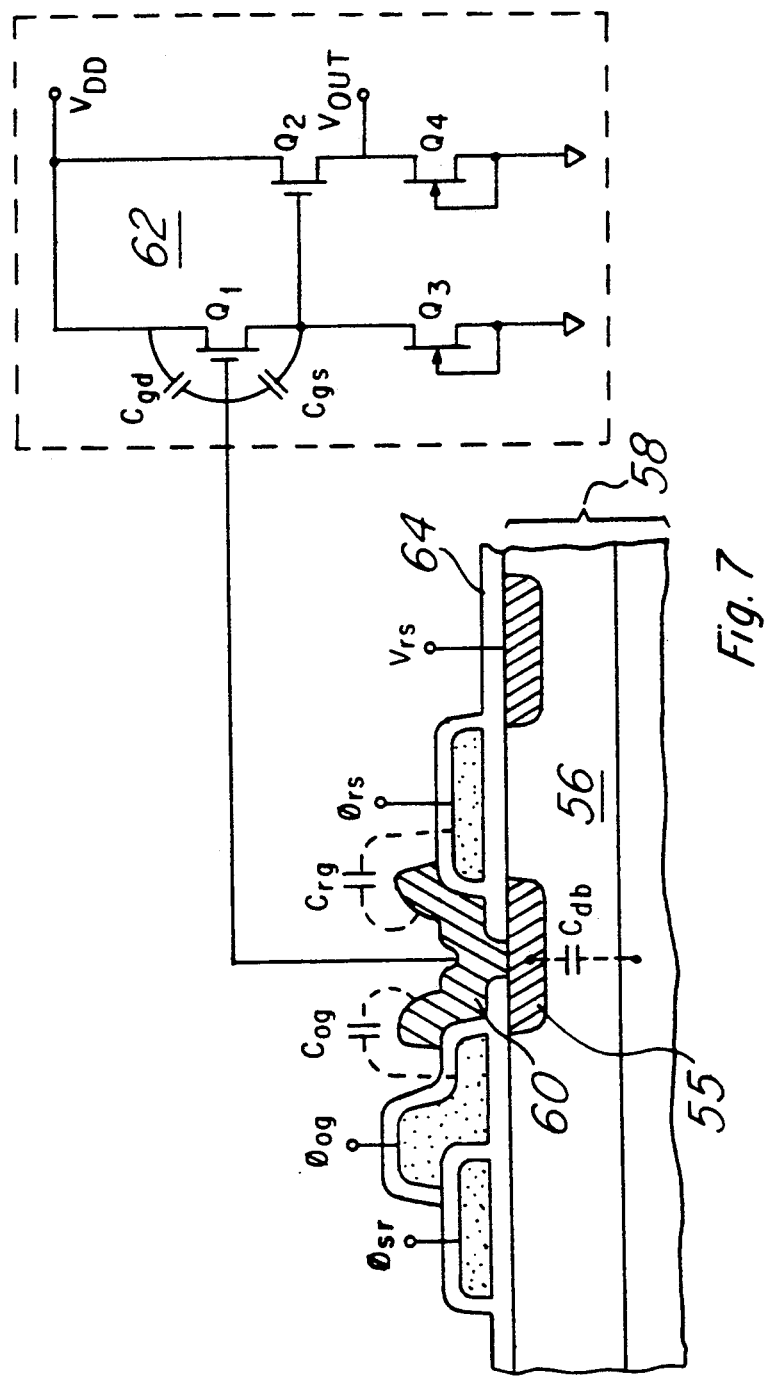
FIG. 7 illustrates a cross-section view of a prior art floating diffusion charge detection node structure for use with CCD image sensors and an associated source-follower amplifier circuit.

Essential to good low noise performance of a CCD image sensor is the charge detection amplifier. Typical charge conversion sensitivity in conventionally available sensors ranges from approximately 4.0 to 10.0 microvolts per electron. This performance level is unsatisfactory for image sensors having high density photosite arrays in which the charge accumulated in each photosite may be only a few electrons. Referring to FIG. 7, a prior art charge detection node and charge detection amplifier are shown. A floating diffusion charge accumulation region 55 is formed in a buried channel region 56 of a semiconductor substrate 58. The floating diffusion charge accumulation region 55 is typically formed in direct contact with an output gate 60, usually metal, connected to a conventional dual-stage source-follower output circuit 62. Charge conversion sensitivity of such a typical detection node is reduced because of the several parasitic capacitances in the detection node and amplifier circuit as shown. Therefore, the circuit also has a large kTC noise. The capacitance of the detection node is then the sum of the parasitic capacitances:

$$C_d = C_{db} + C_{og} + C_{rg} + C_{gd} + C_{gs}$$

which severely limits low noise performance.

Figure 8A:
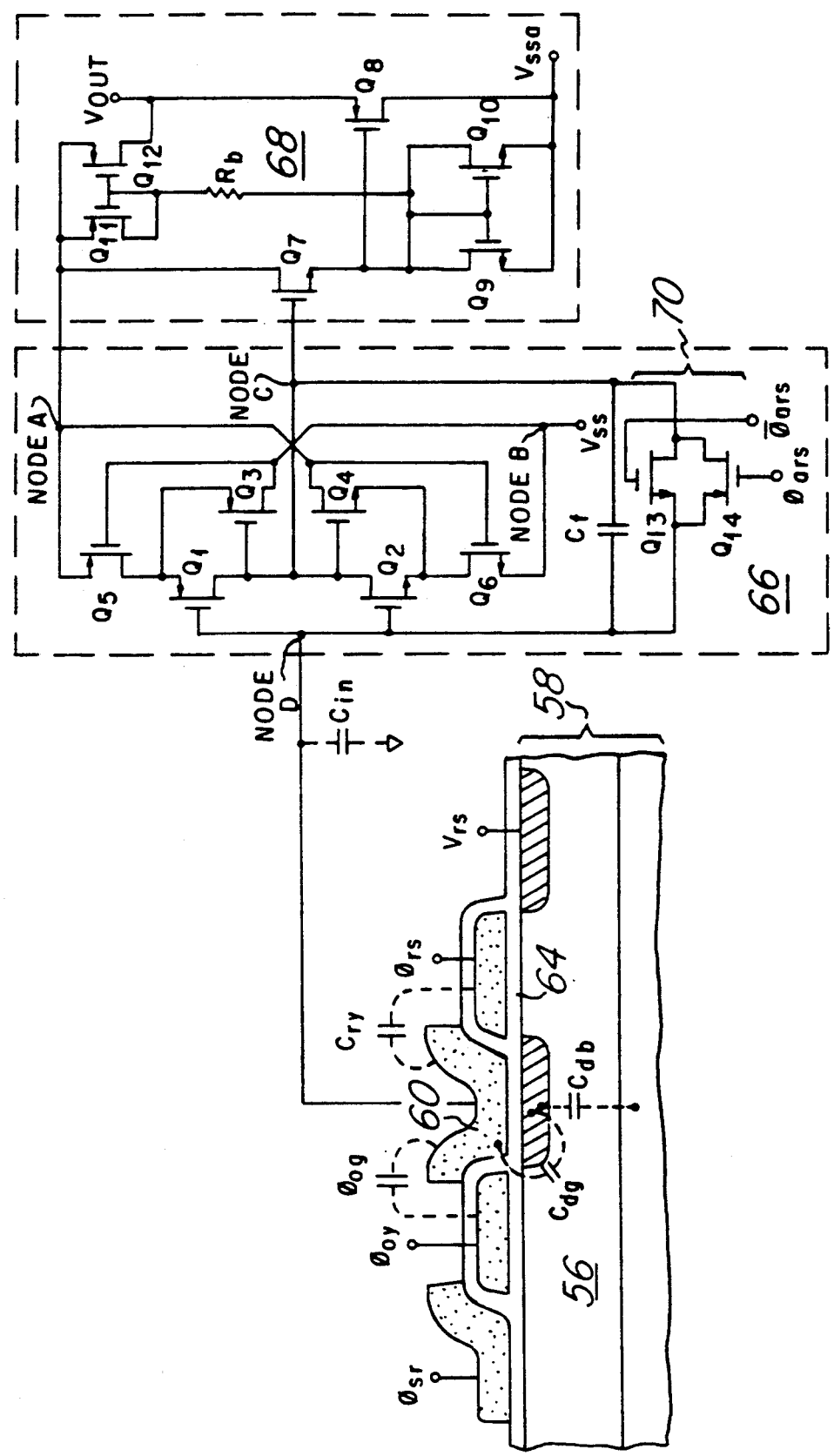
FIG. 8a illustrates a cross-section view of a new capacitively coupled floating diffusion charge detection node structure for use in CCD image sensors and a novel CMOS feedback amplifier circuit which cancels kTC noise and parasitic capacitance.

Referring to FIG. 8a, a new charge detection node structure and charge detection amplifier circuit are shown which minimize kTC noise and parasitic capacitance limiting sensitivity and low noise performance in present CCD sensors. The new amplifier circuit is built using CMOS technology which permits design of high performance feedback through transistor Q3 Q5 and Q4 Q6 amplifiers on the same chip with the CCD sensor array. In the new charge detection node of FIG. 8, the output gate is no longer in direct contact with the floating diffusion charge accumulation region 55, but is separated from and capacitively coupled to it by an insulating layer 64. In a further embodiment of the new charge detection node, the floating diffusion charge detection region 55 can be eliminated altogether and replaced with an n-well, for example. A new, high-performance feedback amplifier circuit 66 is coupled between the charge detection node and a dual stage source follower circuit 68. The positive feedback permits achieving a nearly infinite open loop gain in a single stage which is important for high speed circuit performance. At the same time, negative feedback through node C to node D provides minimization of undesirable loading for the parasitic capacitances which reduce charge conversion sensitivity. For the new capacitively coupled charge detection node, the node capacitance is given by $$Cd = Cdb + Cdg$$

Because negative feedback is provided between nodes C and D via capacitor $C_f$, the amplifier 66 must be reset periodically, but to a different bias voltage reference level than that of the charge detection node. Reset is provided by amplifier reset switch 70 consisting of parallel-connected transistors Q13 and Q14 connected across capacitor Cf and receiving true and complement reset pulses $\phi_{ars}$, at their respective input gates. To account for the differences in bias voltage reference levels, the charge detection node is coupled to the amplifier circuit input through capacitor $C_{dg}$.

A technical advantage of the new charge detection node structure is that removing the DC connection between the output gate 60 and the floating diffusion charge collection region 55 as found in prior art eliminates large area consuming contact structures. The dual stage source follower circuit 68 coupled to the new feedback amplifier 66 is of conventional design and provides adequate drive capability for off-chip loads. The combination of the n-channel transistors Q7, Q9 and Q10 followed by the p-channel transistors Q8, Q11 and Q12 was chosen to compensate for the threshold voltage offsets in these stages and to provide a positive DC bias level for the output signal $V_{out}$.

Figure 9A:
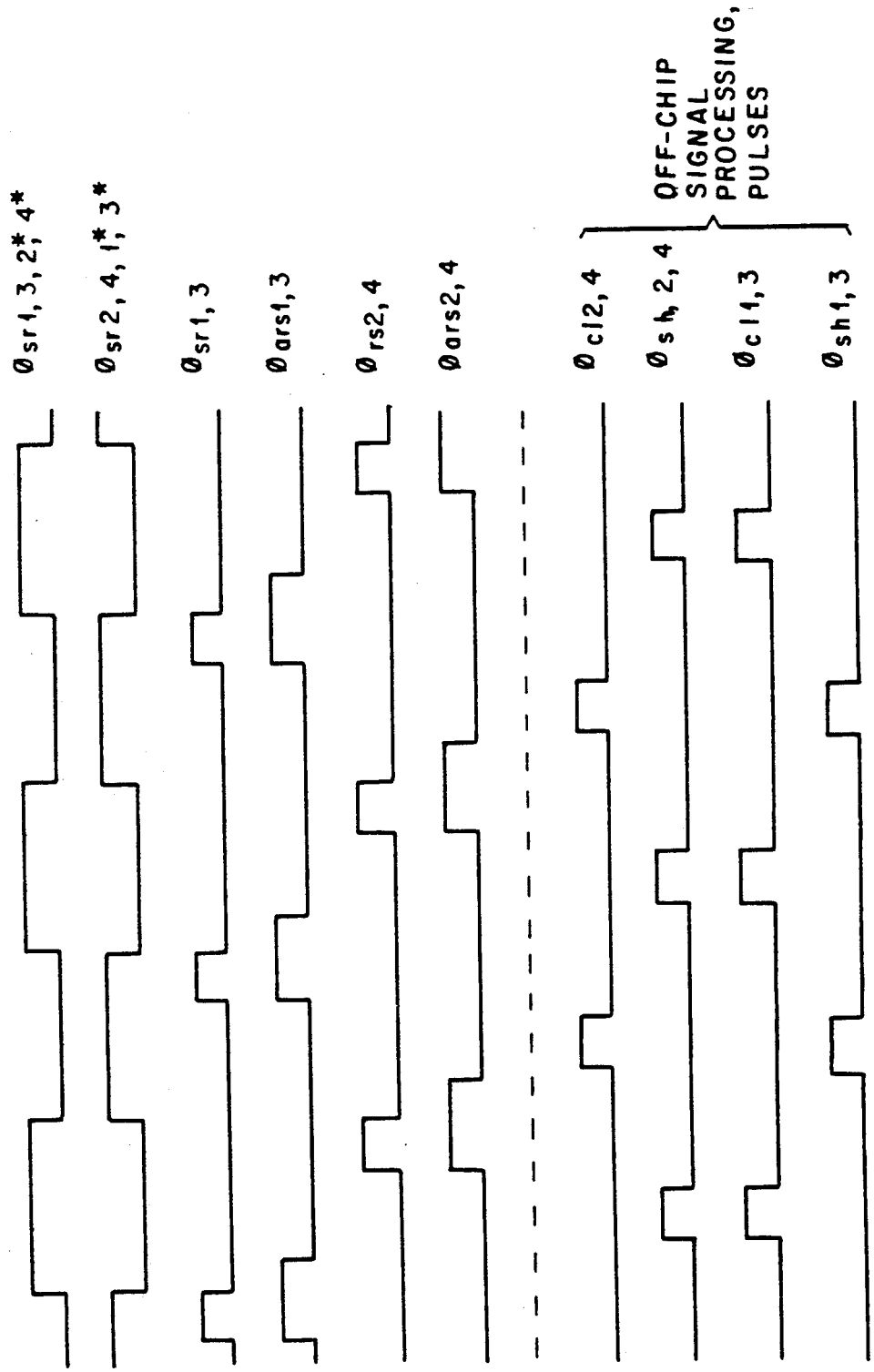

An example of the operation of the new charge detection amplifier in conjunction with the capacitively coupled charge detection node having a floating diffusion charge accumulation region 54 can be understood with reference to FIG. 9a. First, the voltage bias level of the floating diffusion charge detection region 55 is reset by a short pulse. At the same time the amplifier circuit 66 is reset by reset switch 70 but with a longer pulse to eliminate the kTC noise generated on the detection node. After the amplifier reset pulse is released, the charge held by a CCD register is transferred to the detection node. The time interval between the reset release and the charge transfer is used for a clamp pulse to eliminate the kTC noise generated on the amplifier feedback capacitor Cf. After the amplifier response to the received charge settles to a stable level, the output can be sampled. The sampling as well as the clamp are carried out in the off-chip signal processing circuits.

Figure 8B:
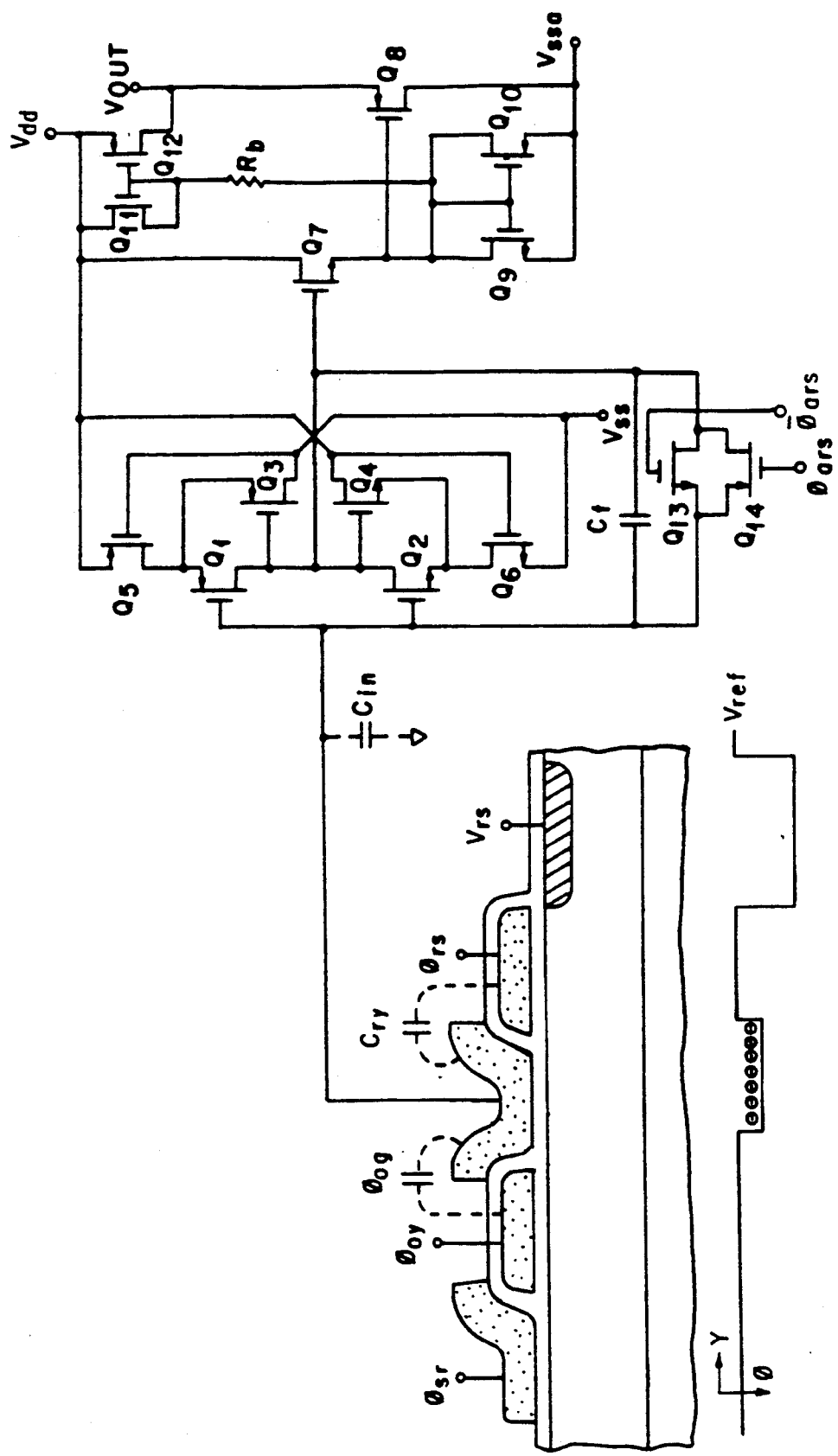
FIG. 8b illustrates an alternative embodiment of the new charge detection node shown in FIG. 8a in which the floating diffusion is replaced with an n-type potential well.

Referring to FIG. 8b, an alternative embodiment of the new charge detection node/charge amplifier circuit is shown in which the n+ floating diffusion region 55 is replaced by an n well. A potential profile for this node is plotted on the node structure as a dotted line. Eliminating the n+diffusion region 55 results in no kTC noise generated in the detection node itself since the charge transfer from the detection well which replaces the diffusion is complete. For this case, it is only necessary to remove the amplifier kTC noise. It is also possible to reset the amplifier only once per charge transfer of a row of photosites and not every photosite which eliminates the kTC noise completely.

Figure 9B:
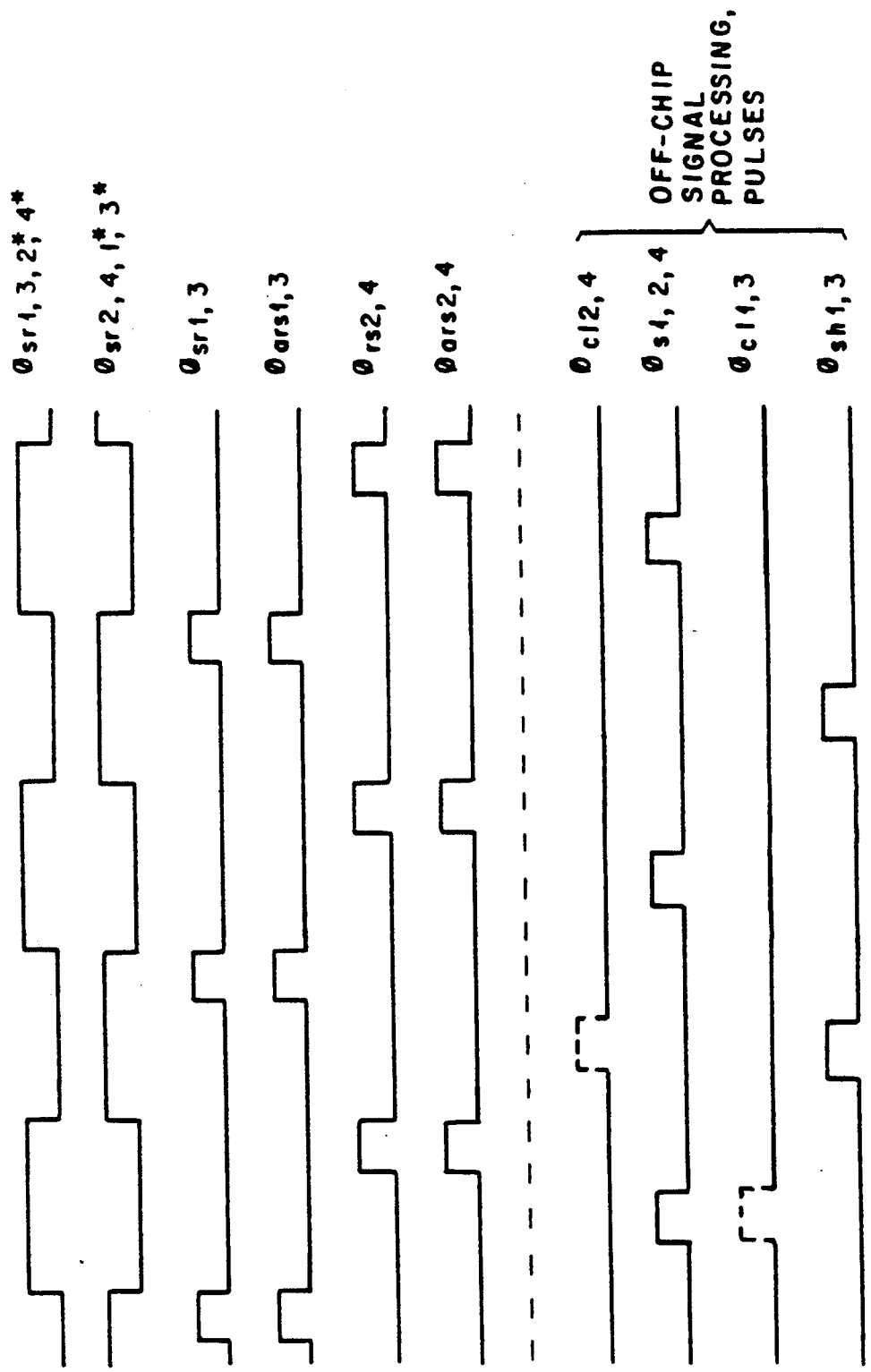
FIG. 9b illustrates a timing diagram showing the operational pulse sequence for the detection node/amplifier circuit of FIG. 8b.

Referring to FIG. 9b, a timing diagram for the embodiment of FIG. 8b is shown illustrating the operational pulse sequence for this embodiment. Note that the amplifier reset pulse and reset gate pulse can coincide. The dotted pulses shown in 0cl 2,4 and 0cl 1,3 indicate there is only one such pulse per line during a dark reference pixel.

The process for building the CCD/CSS image sensor is a double poly single level metal p-well CMOS process. The design rule is relatively conservative with 1.6 microns for most of the geometries and 1.2 microns for the contact holes. The p-well regions in the peripheral circuit areas are the same as the p-well region for the CCD registers. This substantially simplifies the complexity of the process. The CCD structure which was incorporated into the process is a two phase double poly n-type buried channel CCD.

The basic steps of the abbreviated fabrication sequence are illustrated in FIGS. 10a-c. The main processing cycle starts with the ion implantation and diffusion of p-wells 72 in an n type semiconductor region 76 formed on an n+ type semiconductor substrate 78. This is followed by growing a thick field oxide 80 which surrounds the active regions of each transistor and the CCD array. The thick field regions are also implanted prior to oxidation with an appropriate channel stop implants (not shown) to prevent formation of parasitic conduction channels. This is followed by a first gate oxidation, implantation of a buried channel region 82 and the first polysilicon deposition. After the first polysilicon has been deposited it is lightly doped preferably by boron to form the resistive gate 84. This polysilicon is capped by deposited silicon dioxide 86 which is subsequently patterned to define the regions of the resistive gate CCD/CSS charge transfer channels. The exposed polysilicon is then doped again by boron to increase its conductivity. The CCD channel stop regions 90 are defined by ion implantation of boron through the first polysilicon. The important feature to note here is that the patterned capping oxide 86 deposited over the vertical CCD channels serves to self align the resistive gate with the CCD channel stops 90. The first polysilicon level 84 is subsequently etched using the combination of photoresist and the capping oxide 86 as a mask. After this step the thin gate oxide 86 is etched off and regrown to form a second gate oxide (not shown) and the interlevel isolation for a second level of polysilicon 92. This is followed by implantation of CCD barriers (not shown) and a blanket implantation of the threshold shift adjust for the peripheral circuits. Subsequent steps consist of depositing, doping and patterning of the second polysilicon gate level 92. The last important step in the process sequence is the formation of the photosite gate. The selected photosite structure is based on the virtual phase concept and a virtual gate 94 is formed by a shallow boron implantation. The remaining steps of the process consist of implantation of the n+ source and drain regions 96, 98 and the p+ source and drain regions, 100, 102 for the CMOS transistors, interlevel oxide deposition, opening of the contact holes for the metal interconnects, depositing and defining the metal bus interconnects, depositing the protective oxide overcoat, and finally depositing and defining the light shield for the image sensor. The process is completed by etching off the oxide from the bonding pads.

Figure 11:
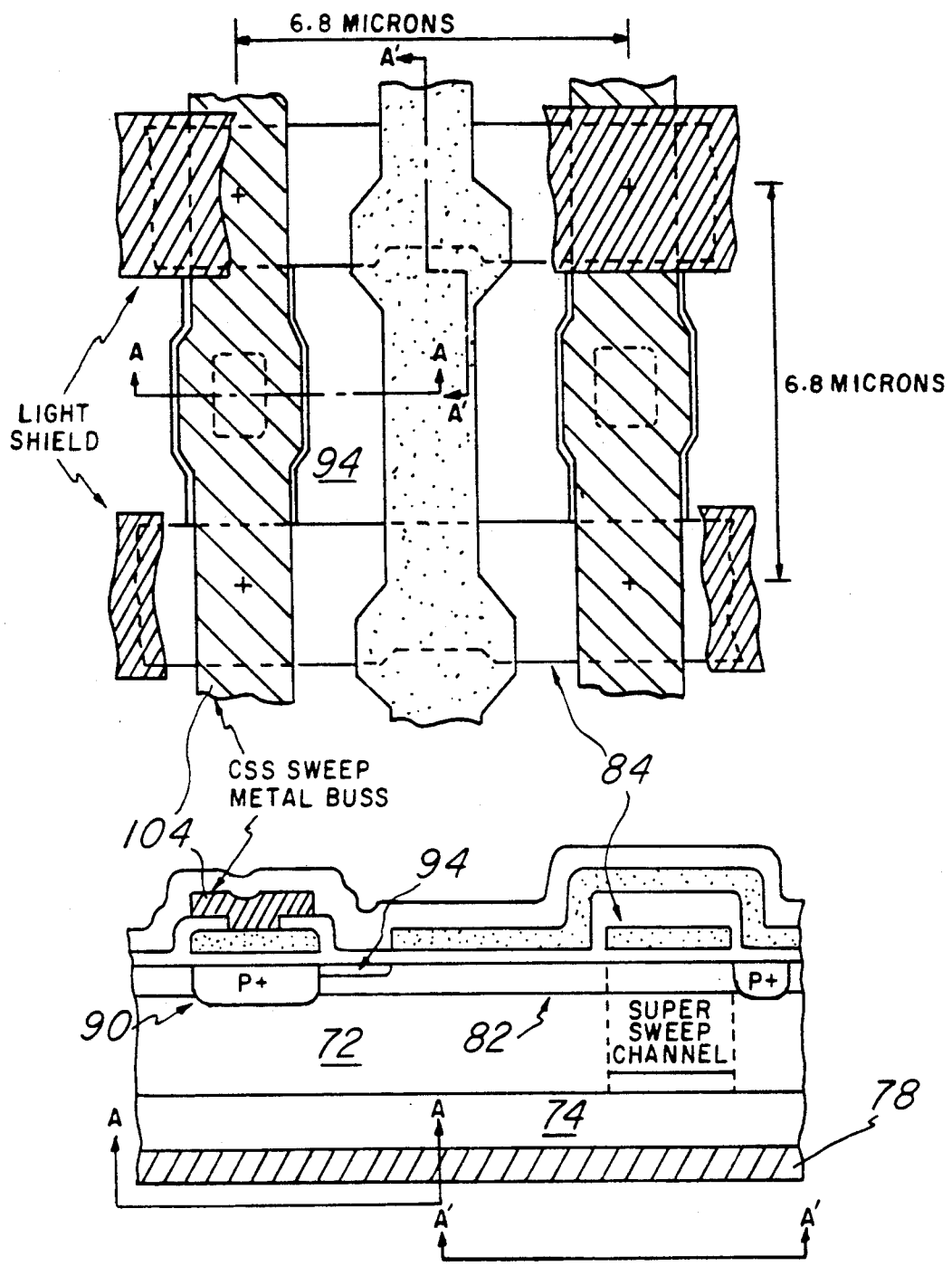

The design topologies of the most important device regions are shown in FIGS. 11 and 12. FIG. 11 shows the layout of a photosite 2. The key feature to note here is the contact arrangement of the metal busses 104 to the resistive gate 84. The contact hole to the first polysilicon level is formed over the channel stop region 90 and not over the active CCD/CSS channel. This eliminates the parasitic potential wells which would otherwise result in the CCD channel due to a change in the polysilicon gate work-function resulting from aluminum alloying with the polysilicon. The driving signals to the resistive gate 84 are thus supplied laterally through the p+ doped regions 90 extending from the contact holes. The photosite 2 itself is a combination of a virtual well and a clocked barrier structure as shown in FIG. 11. The virtual gate concept has an advantage in the complete charge transfer from the photosite 2 which prevents the image lag.

Other important topologies in the new device architecture are the interfaces between the CCD/CSS vertical charge transfer channels 8, storage wells 14, and then transferred to the multiple horizontal shift registers 18 These are illustrated in FIG. 12. As seen in this figure, the super sweep charge is accumulated in two rows of storage wells 14. It can be also directed to the charge clearing drains 44 through the gates 46. The two rows of collection wells have been used here to provide storage for the transfer of two lines of data in one horizontal blanking interval. The charge storage regions are followed by the multiplexing gates 48 which rearrange the charge from pairs of horizontal photosites into a vertical sequence. The charge from these regions then proceed into multiple horizontal registers 18 which are separated by the transfer gates 16. The transfer gate of the most outer edge register interfaces this register with the charge clearing drain 50. The charge transfer in all the regions shown in FIG. 12 can be easily followed in this figure as it flows from well to well according to the bias applied to the corresponding gates.

I claim:

1. An image sensing system comprising:
   a planar array of photosites in a semiconductor substrate, said photosites accumulating charge carriers proportional to incident radiation;
   a series of elongate columnar charge transfer channels in said substrate coupled to receive said accumulated charge carriers from selected rows of said photosites;
   a plurality of elongate members, each said member overlaying an associated one of said charge transfer channels;
   a scanner, said scanner including a traveling wave driver circuit coupled to apply a traveling wave pulse to said plurality of elongate members, said pulse controlling movement of said accumulated charge carriers in said charge transfer channels; and
   means for storing said accumulated charge for subsequent readout.

2. An imaging system as described in claim 1 further including an address decoder for accessing a selected row of photosites for transfer of said accumulated charge carriers to said charge transfer channels.

3. An imaging system as described in claim 1 wherein said elongate members are resistive gates.

4. An imaging system as described in claim 1 wherein said traveling wave driver circuit includes a delay line having a plurality of high current drivers coupled between said elongate members and said delay line at selected points along said delay line.

5. An architecture for an imaging system comprising:
   a planar array of photosites, said photosites accumulating charge carriers in response to incident light;
   a series of elongate columnar charge transfer channels coupled to receive said accumulated charge carriers from selected rows of said photosites;
   a plurality of elongate members, each said member overlaying an associated one of said charge transfer channels;
   an address decoder for transferring said accumulated charge carriers in selected rows of said photosites into said charge transfer channels;
   a scanner, said scanner including a traveling wave driver circuit coupled to apply a traveling wave pulse to said plurality of elongate members, said pulse controlling movement of said accumulated charge carriers in said charge transfer channels;
   storage means for storing said accumulated charge carriers of a plurality of distinct rows of said photosites; and
   readout means for selectively reading out said accumulated charge carriers for distinct rows of said photosites as a multichannel output signal.

6. The architecture of claim 5 wherein said elongate members are resistive gates, each resistive gate overlaying a respective charge transfer channel.

7. The architecture of claim 5 further including a series of clearing gates coupled at the end of said series of charge transfer channels such that the accumulated charge carriers in said channels can be selectively directed to a number of clearing drains.

8. The architecture of claim 5 wherein said readout means includes a pair of multiplexers coupled between said storage means and a multichannel output of said imaging system.

9. The architecture of claim 5 wherein said traveling wave driver circuit includes a delay line having a plurality of high current drivers coupled between said elongate members and said delay line at selected points along said delay line.

10. An architecture for an imaging system comprising:
    a planar array of photosites, said photosites accumulating charge carriers in response to incident light;
    a series of elongate columnar charge transfer channels coupled to receive said accumulated charge carriers from selected rows of said photosites;
    a plurality of elongate members, each said member overlaying an associated one of said charge transfer channels;
    an address decoder for transferring said accumulated charge carriers in selected rows of said photosites into said charge transfer channels;

a scanner, said scanner including a traveling wave driver circuit coupled to apply a traveling wave pulse to said plurality of elongate members, said pulse controlling movement of said accumulated charge carriers in said charge transfer channels;

storage means for storing all the accumulated charge carriers of the entire planar array; and readout means for selectively reading out said accumulated charge carriers of the entire array as a multichannel output signal.

11. The architecture of claim 10 wherein said elongate members are resistive gates, each resistive gate overlaying a respective charge transfer channel.

12. The architecture of claim 10 further including a series of clearing gates coupled at the end of said series of charge transfer channels such that the accumulated charge carriers in said channels can be selectively directed to a number of clearing drains.

13. The architecture of claim 10 wherein said readout means includes a pair of multiplexers coupled between said storage means and a multichannel output of said imaging system.

14. The architecture of claim 10 wherein said traveling wave driver circuit includes a delay line having a plurality of high current drivers coupled between said elongate members and said delay line at selected points along said delay line.

15. A light sensing semiconductor structure for use in an image sensor system, said semiconductor structure comprising:

a semiconductor substrate of a first conductivity type;

a first semiconductor layer of the first conductivity type formed on said substrate;

an array of photosites formed in said semiconductor layer, each said photosite accumulating charge carriers in response to incident light;

a second patterned semiconductor layer formed over said array of photosites, said second patterned layer having a plurality of interconnected first and second portions forming respective charge carrier transport and charge carrier sweep gates;

a semiconductor insulator layer formed over said second patterned semiconductor layer;

a third patterned semiconductor layer formed over said insulator layer having a plurality of elongate interconnected portions coupling said photosites to selected peripheral circuits; and an array of elongate metal interconnects formed over said substrate coupling said second patterned semiconductor layer to a charge sweep scanner circuit, said scanner circuit including a traveling wave driver circuit coupled to apply a traveling wave pulse to said array of elongate metal interconnects.

16. The semiconductor structure of claim 15 wherein said photosites include buried channel regions of the first semiconductor type formed in said first semiconductor layer and virtual gate regions of a second semiconductor type formed in said buried channel regions.

17. The semiconductor structure of claim 15 wherein said first and second portions of said second patterned semiconductor layer have different doping levels.

18. The semiconductor structure of claim 15 wherein said first semiconductor layer is n type and said second semiconductor layer is p type.

19. The semiconductor structure of claim 15 wherein said second and third patterned semiconductor layers are polysilicon.

20. The image system as described in claim 1 further including a series of clearing gates coupled at the end of said series of charge transfer channels such that the accumulated charge carriers in said channels can be selectively directed to a number to clearing drains.

21. A still video camera providing an image sensor having electronic focal plane shutter control, wherein said image sensor comprises:

a planar array of photosites, said photosites accumulating charge carriers in response to incident light;

a series of elongate columnar charge transfer channels coupled to receive said accumulated charge carriers from selected rows of said photosites;

a plurality of elongate members, each said member overlaying an associated one of said charge transfer channels;

an address decoder for accessing a selected row of photosites for transfer of said accumulated charge carriers to said charge transfer channels;

a scanner, said scanner including a traveling wave driver circuit coupled to apply a traveling wave pulse to said plurality of elongate members, said pulse controlling movement of said accumulated charge carriers in said charge transfer channels;

storage means for storing said accumulated charge carriers of a plurality of distinct rows of said photosites;

a series of clearing gates coupled at the end of said series of charge transfer channels such that the accumulated charge carriers in said channel can be selectively directed to a number of clearing drains; and readout means for selectively reading out said accumulated charge carriers for distinct rows of said photosites as a multichannel output signal.

22. The still video camera of claim 21 wherein said elongate members are resistive gates, each resistive gate overlaying a respective charge transfer channel.

23. The still video camera of claim 21 wherein said readout means includes a pair of multiplexers coupled between said storage means and a multichannel output of said image sensor.

* * * * *